United States Patent
Eun et al.

(10) Patent No.: US 8,493,769 B2
(45) Date of Patent: Jul. 23, 2013

(54) MEMORY DEVICES INCLUDING DECODERS HAVING DIFFERENT TRANSISTOR CHANNEL DIMENSIONS AND RELATED DEVICES

(75) Inventors: Sung-ho Eun, Seoul (KR); Jae-Hee Oh, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 252 days.

(21) Appl. No.: 12/724,465

(22) Filed: Mar. 16, 2010

(65) Prior Publication Data

US 2010/0238709 A1 Sep. 23, 2010

(30) Foreign Application Priority Data

Mar. 18, 2009 (KR) .................. 10-2009-0023169

(51) Int. Cl.
*G11C 11/00* (2006.01)

(52) U.S. Cl.
USPC ........... 365/148; 365/153; 365/158; 365/171; 365/173

(58) Field of Classification Search
USPC .................. 365/148, 153, 158, 171, 173, 175
See application file for complete search history.

(56) References Cited

U.S. PATENT DOCUMENTS

| | | | |
|---|---|---|---|
| 6,097,622 A * | 8/2000 | Shimizu et al. | 365/145 |
| 6,950,367 B2 * | 9/2005 | Kaneko | 365/230.03 |
| 2002/0172073 A1 * | 11/2002 | Hidaka | 365/158 |
| 2003/0185085 A1 * | 10/2003 | Kaneko | 365/230.03 |
| 2004/0232460 A1 * | 11/2004 | Kajiyama | 257/295 |
| 2009/0034323 A1 * | 2/2009 | Lung et al. | 365/163 |
| 2009/0103343 A1 * | 4/2009 | Park et al. | 365/51 |
| 2010/0118588 A1 * | 5/2010 | Chen et al. | 365/148 |

FOREIGN PATENT DOCUMENTS

| | | |
|---|---|---|
| JP | 07-122718 | 5/1995 |
| JP | 2002-111474 | 4/2002 |
| JP | 2003-282823 | 10/2003 |
| KR | 1020050101834 A | 10/2005 |

* cited by examiner

*Primary Examiner* — Pho M Luu
*Assistant Examiner* — Thao Bui
(74) *Attorney, Agent, or Firm* — Myers Bigel Sibley & Sajovec, P.A.

(57) ABSTRACT

An integrated circuit memory device includes a memory cell array comprising memory cells having respective data storage regions therein, a plurality of pass transistors having different channel widths and/or channel lengths, and a plurality of conductive lines. Each of the conductive lines electrically couple a respective one of the pass transistors to ones of the memory cells. Each of the memory cells has a line resistance defined by a portion of the corresponding one of the conductive lines extending between the memory cell and the pass transistor coupled thereto. Ones of the memory cells having greater line resistances are coupled to ones of the pass transistors having greater channel widths and/or shorter channel lengths than ones of the memory cells having smaller line resistances. Each of the memory cells may also include a diode therein, and ones of the memory cells having greater line resistances may include diodes having lower resistances. Related devices are also discussed.

27 Claims, 9 Drawing Sheets

MEMORY DEVICES INCLUDING DECODERS HAVING DIFFERENT TRANSISTOR CHANNEL DIMENSIONS AND RELATED DEVICES

CROSS-REFERENCE TO RELATED APPLICATION

This U.S. non-provisional patent application claims priority under 35 U.S.C. §119 from Korean Patent Application No. 2009-0023169 filed on Mar. 18, 2009, the disclosure of which is hereby incorporated by reference herein in its entirety.

BACKGROUND

The present inventive concept relates to integrated circuit devices, and, in particular, to integrated circuit memory devices.

Memory devices that employ variable resistance materials include resistive random access memories (RRAM), phase changeable random access memories (PRAM), ferroelectric random access memories (FRAM), magnetic random access memories (MRAM), etc. While dynamic random access memories (DRAM) and/or flash memory devices may store data based on stored charges, the nonvolatile memory devices listed above may store data based on a variation in the resistance of a variable resistance material (RRAM), a phase changeable material having amorphous and crystalline states (PRAM), a ferroelectric material having different polarization states (FRAM), and/or a magnetic tunnel junction (MTJ) film of a ferroelectric material having different magnetized states (MRAM).

A memory cell array may include a plurality of such memory elements, also referred to herein as memory cells. Each memory cell is coupled between a word line and a bit line. However, as memory devices are scaled-down, the resistances of the bit lines and/or word lines may increase, for example, due to the relative decrease in the dimensions of the bit lines and/or word lines. Moreover the line resistances of the memory cells may differ based on the location of the memory cells. For example, memory cells that are further from the row and/or column decoders may have greater line resistances than memory cells that are closer to the row and/or column decoders, due to the differences in the lengths of the bit lines and/or word lines coupled thereto.

SUMMARY

According to some embodiments of the present inventive concept, an integrated circuit memory device includes a memory cell array including memory cells having respective data storage regions therein, a plurality of pass transistors having different channel widths and/or channel lengths, and a plurality of conductive lines. Each of the conductive lines electrically couples a respective one of the pass transistors to ones of the memory cells. Each of the memory cells has a line resistance defined by a portion of the corresponding one of the conductive lines extending between the memory cell and the pass transistor coupled thereto. Ones of the memory cells having greater line resistances are coupled to ones of the pass transistors having greater channel widths and/or shorter channel lengths.

In some embodiments, the plurality of pass transistors may be row pass transistors that define a row decoder, each of the conductive lines may be a word line electrically coupling a respective one of the row pass transistors to ones of the memory cells in a respective row of the array, and the line resistance of each of the memory cells may define a word line resistance. The memory device may further include a column decoder comprising column pass transistors having different channel widths and/or channel lengths, and a plurality of bit lines. Each of the bit lines may electrically couple a respective one of the column pass transistors to ones of the memory cells in a respective column of the array. Each of the memory cells may have a bit line resistance defined by a portion of the corresponding bit line extending between the memory cell and the column pass transistor coupled thereto, and ones of the memory cells having greater bit line resistances may be coupled to ones of the column pass transistors having greater channel widths and/or shorter channel lengths.

In some embodiments, each of the memory cells may be configured to electrically connect a corresponding word line to a corresponding bit line such that the corresponding word line resistance and the corresponding bit line resistance define a total line resistance for that memory cell.

In some embodiments, each of the memory cells may include a diode therein, and ones of the memory cells having greater total line resistances may respectively include a diode having a lower resistance than ones of the memory cells having smaller total line resistances.

In some embodiments, ones of the memory cells coupled to a same row pass transistor by a respective word line may have different word line resistances therealong, and ones of the memory cells having greater word line resistances along the respective word line may be coupled to respective ones of the column pass transistors having greater channel widths and/or shorter channel lengths.

In some embodiments, ones of the memory cells coupled to a same column pass transistor by a respective bit line may have different bit line resistances therealong, and ones of the memory cells having greater bit line resistances along the respective bit line may be coupled to respective ones of the row pass transistors having greater channel widths and/or shorter channel lengths.

In some embodiments, the ones of the memory cells having greater word line resistances may be located at greater distances from the row decoder along the respective word lines, and the ones of the memory cells having greater bit line resistances may be located at greater distances from the column decoder along the respective bit lines.

In some embodiments, the channel widths of the row pass transistors may increase from a first one of the row pass transistors closest to the column decoder to a last one of the row pass transistors furthest therefrom. Also, the channel widths of the column pass transistors may increase from a first one of the column pass transistors closest to the row decoder to a last one of the column pass transistors furthest therefrom. For example, the channel widths of the row pass transistors and/or the column pass transistors may increase in a substantially linear or stepwise fashion.

In some embodiments, the row decoder may include first and second row decoders extending along opposite sides of the memory cell array, and the column decoder may include first and second column decoders extending along opposite sides of the memory cell array. Ones of the row pass transistors proximate to the first and/or second column decoders may have narrower channel widths than ones of the row pass transistors distal therefrom, and ones of the column pass transistors proximate to the first and/or second row decoders may have narrower channel widths than ones of the column pass transistors distal therefrom.

In some embodiments, the channel lengths of the row pass transistors may decrease from a first one of the row pass transistors closest to the column decoder to a last one of the row pass transistors furthest therefrom. In addition, the channel lengths of the column pass transistors may decrease from a first one of the column pass transistors closest to the row decoder to a last one of the column pass transistors furthest therefrom. For example, the channel lengths of the row pass transistors and/or the column pass transistors decrease in a substantially linear or stepwise fashion.

In some embodiments, the row decoder may include first and second row decoders extending along opposite sides of the memory cell array, and the column decoder may include first and second column decoders extending along opposite sides of the memory cell array. Ones of the row pass transistors proximate to the first and/or second column decoders may have greater channel lengths than ones of the row pass transistors distal therefrom, and ones of the column pass transistors proximate to the first and/or second row decoders may have greater channel lengths than ones of the column pass transistors distal therefrom.

In some embodiments, the relative channel widths of ones of the pass transistors are proportional to the relative line resistances of the respective memory cells coupled thereto.

In some embodiments, the relative channel lengths of ones of the pass transistors are inversely proportional to the relative line resistances of the respective memory cells coupled thereto.

In some embodiments, the memory device may be one of a resistive random access memory (RRAM) device including resistive storage elements therein, a magnetic random access memory (MRAM) device including magnetic storage elements therein, and a phase-changeable random access memory (PRAM) device including phase-changeable storage elements therein.

In some embodiments, the memory device may be a memory unit of a data storage device. The data storage device may include the memory unit; a memory interface unit configured to communicate with the memory unit; a host interface configured to communicate with a host device; a processor; and a bus that communicatively couples the processor, the memory interface, and the host interface.

In some embodiments, the memory device may be a memory unit of an electronic system. The electronic system may include the memory unit; a processor; a user interface; and a bus that communicatively couples the processor, the memory unit, and the user interface.

According to further embodiments of the present inventive concept, an integrated circuit memory device includes first and second conductive lines; a memory cell array including a first memory cell and a second memory cell coupled to the first and second conductive lines, respectively; and a first pass transistor and a second pass transistor coupled to the first and second conductive lines, respectively. The second pass transistor has a greater channel width and/or a shorter channel length than the first pass transistor. A resistance between the second memory cell and the second pass transistor along the second conductive line is greater than a resistance between the first memory cell and the first pass transistor along the first conductive line.

In some embodiments, the first and second pass transistors may be first and second row pass transistors of a row decoder, and the first and second conductive lines may be first and second word lines. The memory device may further include first and second bit lines coupled to the first and second memory cells, respectively; and a column decoder including first and second column pass transistors coupled to the first and second bit lines, respectively. The second column pass transistor may have a greater channel width and/or a shorter channel length than the first column pass transistor. A resistance between the second memory cell and the second column pass transistor along the second bit line may be greater than a resistance between the first memory cell and the first column pass transistor along the first bit line.

In some embodiments, the first memory cell may be configured to electrically connect the first bit line to the first word line such that the resistance along the first bit line and the resistance along the first word line define a total line resistance for the first memory cell. Also, the second memory cell may be configured to electrically connect the second bit line to the second word line such that the resistance along the second bit line and the resistance along the second word line define a total line resistance for the second memory cell that is greater than the total line resistance for the first memory cell.

In some embodiments, the first and second memory cells may include first and second diodes, respectively. The first diode may have a greater resistance than the second diode.

In some embodiments, a distance between the second memory cell and the second pass transistor along the second conductive line may be greater than a distance between the first memory cell and the first pass transistor along the first conductive line.

According to still further embodiments of the present inventive concept, an integrated circuit memory device may include a memory cell array including memory cells having respective data storage regions and diodes therein; a plurality of pass transistors; and a plurality of conductive lines. Each of the conductive lines electrically couples a respective one of the pass transistors to ones of the memory cells. Each of the memory cells has a line resistance defined by a portion of the corresponding one of the conductive lines extending between the memory cell and the pass transistor coupled thereto. Ones of the memory cells having greater line resistances include diodes having lower resistances.

In some embodiments, the plurality of pass transistors may be row pass transistors that define a row decoder, each of the conductive lines may be a word line electrically coupling a respective one of the row pass transistors to ones of the memory cells in a respective row of the array, and the line resistance of each of the memory cells may define a word line resistance. The memory device may further include a column decoder including column pass transistors having different channel widths and/or channel lengths; and a plurality of bit lines, each of the bit lines electrically coupling a respective one of the column pass transistors to ones of the memory cells in a respective column of the array. Each of the memory cells may have a bit line resistance defined by a portion of the corresponding bit line extending between the memory cell and the column pass transistor coupled thereto. Each of the memory cells may be configured to electrically connect a corresponding word line to a corresponding bit line such that the corresponding word line resistance and the corresponding bit line resistance define a total line resistance for that memory cell. Ones of the memory cells having greater total line resistances may include diodes having lower resistances.

In some embodiments, the pass transistors may have different channel widths and/or channel lengths. The ones of the memory cells having the greater line resistances may be coupled to ones of the pass transistors having greater channel widths and/or shorter channel lengths than ones of the memory cells having smaller line resistances.

In some embodiments, the ones of the memory cells having the greater line resistances may be located at greater distances from the pass transistor coupled thereto along the corresponding one of the conductive lines extending therebetween.

Other elements and/or devices according to some embodiments will become apparent to one with skill in the art upon review of the following drawings and detailed description. It is intended that all such additional devices, in addition to any combination of the above embodiments, be included within this description, be within the scope of the inventive concept, and be protected by the accompanying claims.

DETAILED DESCRIPTION OF EMBODIMENTS

The present inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections, should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "under", "above", "upper," "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" or "over" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer or element is referred to as being "between" two layers/elements, it can be the only layer or element between the two layers/elements, or one or more intervening layers/elements may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Embodiments of the inventive concept are described herein with reference to cross-section illustrations that are schematic illustrations of idealized embodiments (and intermediate structures) of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Some embodiments of the present inventive concept provide memory devices that compensate for the differences in line resistance of memory cells at different locations of a memory cell array. As used herein, "line resistance" refers to the resistance of a portion of a conductive line (such as a word line and/or bit line) that couples a particular memory cell to a pass transistor (such as provided in a row and/or column decoder). For example, when applying programming current to memory cells having different line resistances, greater current may be required for memory cells that are coupled to higher-resistance lines. However, if greater current is provided to these memory cells, over-programming may occur in memory cells that are coupled to lower-resistance lines.

Accordingly, some embodiments of the present invention provide row and/or column decoders including pass transistors that have different channel dimensions (e.g., different channel widths and/or channel lengths). As such, memory cells having greater line resistances are coupled to ones of the pass transistors having greater channel widths and/or shorter channel lengths, to at least partially compensate for the differences in line resistance between memory cells (for example, due to the different locations of the cells in a memory cell array). In addition or alternatively, the resistance of a diode included in each memory cell may be varied to at least partially compensate for the differences in line resistance of memory cells at different locations of a memory cell array. For example, memory cells coupled to higher-resistance lines may include larger, lower-resistance diodes therein.

Figure 1:
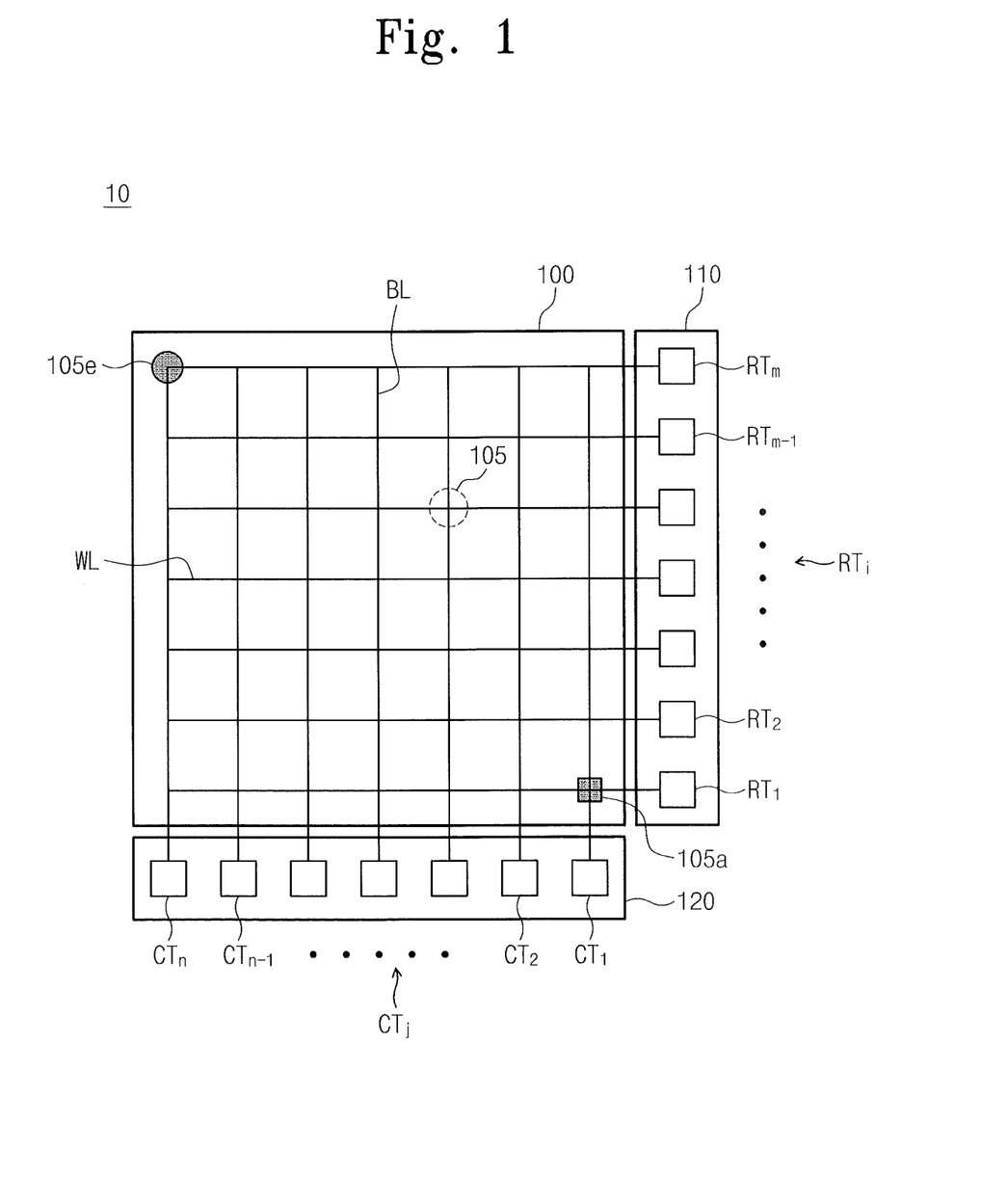
FIG. 1 is a block diagram illustrating a memory device according to some embodiments of the present inventive concept.

FIG. 1 illustrates a resistive memory device according to some embodiments of the present inventive concept. As shown in FIG. 1, the resistive memory device 10 includes a memory cell array 100 and peripheral elements 110 and 120. The memory cell array 100 includes a plurality of memory cells 105. The memory cells 105 are provided at cross-points between bit lines BL and word lines WL, which extend in orthogonal directions. In other words, each memory cell 150 is coupled between a word line WL and a bit line BL. The peripheral elements 110 and 120 include pass transistors that are configured to supply electrical signals to the word lines WL and/or bit lines BL. For example, as shown in FIG. 1, the peripheral element 110 is a row decoder including a plurality of row pass transistors RT1, RT2, . . . RTm−1, RTm, and the peripheral element 120 is a column decoder including a plurality of column pass transistors CT1, CT2, . . . CTn−1, CTn. Each memory cell 105 is electrically coupled to one of the row pass transistors RT1 to RTm by a word line WL, and is electrically coupled to one of the column pass transistors CT1 to CTn by a bit line BL. Accordingly, when selected by the row decoder 110 and the column decoder 120, each memory cell 105 is configured to electrically connect a portion of bit line BL and a word line WL in the same current path.

Figure 2A:
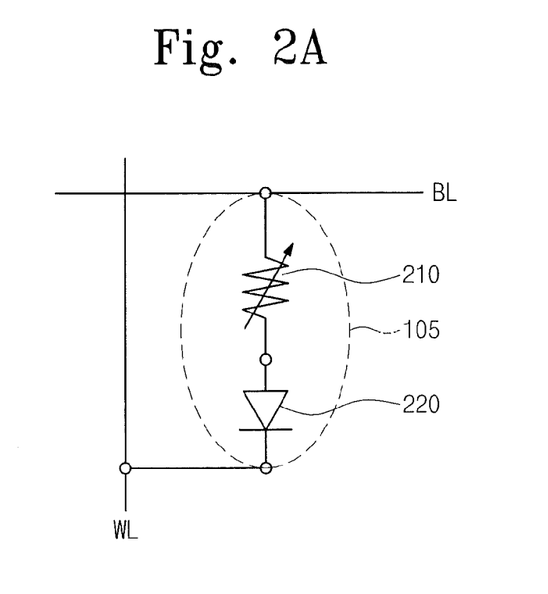
FIGS. 2A and 2B are schematic diagrams illustrating a memory cell of a memory cell array according to some embodiments of the present inventive concept.
Figure 2B:
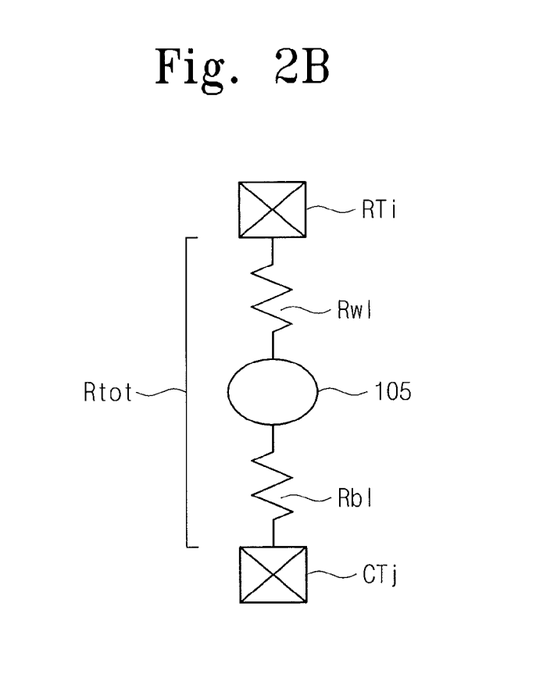

FIGS. 2A and 2B are schematic diagrams illustrating a memory cell 105 of the memory cell array 100 in greater detail according to some embodiments. As shown in FIG. 2A, the memory cell 105 may include a variable-resistance memory element 210 and a diode element 220 connected in series. The application of electrical signals on a corresponding bit line BL and/or word line WL may be used to alter a resistive state of the variable resistance memory element 210, which may thereby affect the output voltage when the memory cell 105 is read. Thus, the variable resistance memory element 210 may be used to provide a data storage region. The variable resistance memory element 210 may be, for example, a variable resistance material, a phase changeable material (such as a chalcogenide alloy), a ferroelectric material (such as lead zirconate titanate), and/or a magnetic tunnel junction (MTJ) film. As such, the memory cell array 100 may be used in RRAM, PRAM, FRAM, and/or MRAM devices. However, other materials having variable and/or multiple resistive states may also be used.

FIG. 2B is an equivalent circuit diagram illustrating the line resistance (also referred to herein as "cell resistance") of a memory cell 105 electrically coupled to a row pass transistor RTi and a column pass transistor CTj by a corresponding word line WL and a corresponding bit line BL, respectively. As shown in FIG. 2B, the total line resistance Rtot for a memory cell 105 is defined as the sum of the word line resistance Rwl of the portion of the word line WL extending from the memory cell 105 to the row pass transistor RTi, and the bit line resistance Rbl of the portion of the bit line BL extending from the memory cell 105 to the column pass transistor CTj. In some embodiments, the total line resistance Rtot may also take into account the resistance Rdiode of the diode 220. In other words, Rtot=Rwl+Rbl+Rdiode for each memory cell 105. However, memory cells 105 at different locations in the array 100 may have different line resistances, due to the differences in the lengths of the portions of the bit lines and word lines extending from a particular cell to its corresponding column decoder and row decoder. For example, as shown in FIG. 1, a memory cell 105a that is closest to the row decoder 110 and the column decoder 120 has a lower line resistance than a memory cell 105e that is furthest from the row decoder 110 and the column decoder 120.

Figure 3:
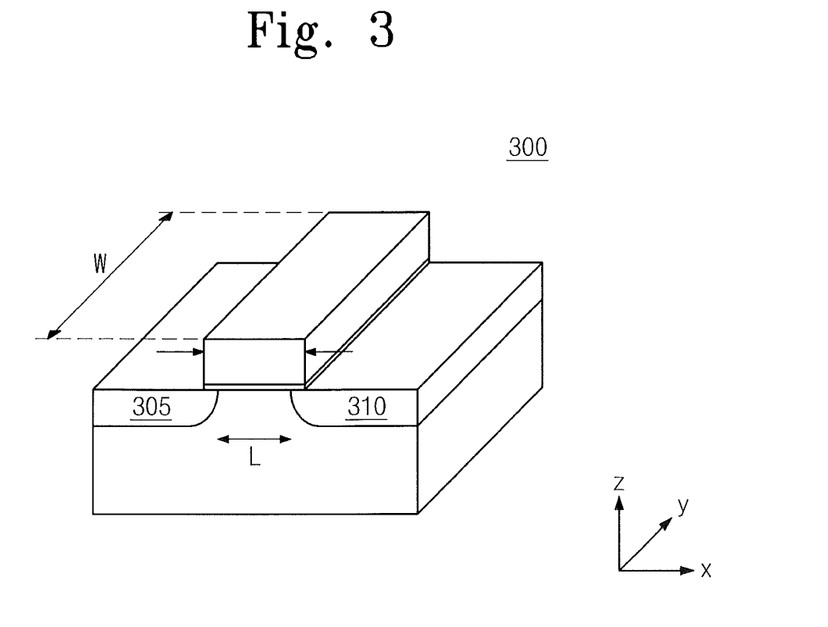
FIG. 3 is a perspective view illustrating a pass transistor according to some embodiments of the present inventive concept.

Accordingly, embodiments of the present inventive concept provide pass transistors having different channel widths and/or channel lengths, where memory cells having greater line resistances are coupled to pass transistors having greater channel widths and/or shorter channel lengths. FIG. 3 is a perspective view illustrating such a pass transistor 300. As shown in FIG. 3, the channel length L of the pass transistor 300 is defined as the distance between the source region 305 and the drain region 310 of the transistor 300 along the x-direction. The channel width W of the transistor 300 is defined along the y-direction in FIG. 3, which is perpendicular to the channel length L. The channel width W and the channel length L may define the current-driving capability and conductivity of the pass transistor 300. In particular, transistors having shorter channel lengths L may provide lower resistances, while transistors having greater channel widths W may provide greater current-driving capability. As such, one or more pass transistors in the row decoder 110 and/or column decoder 120 may have different channel widths W and/or channel lengths L to at least partially compensate for the differences in line resistance of memory cells in different locations of the memory cell array 100.

In some embodiments, each memory cell 105 may additionally or alternatively include a diode 220 of a different resistance and/or size to at least partially compensate for the differences in line resistance of memory cells in different locations of the memory cell array 100. In particular, as the total line resistance Rtot=Rwl+Rbl+Rdiode, larger diodes (having lower resistances Rdiode) may be used in memory cells coupled to higher-resistance word lines and/or bit lines to offset the higher resistances.

Figure 4A:
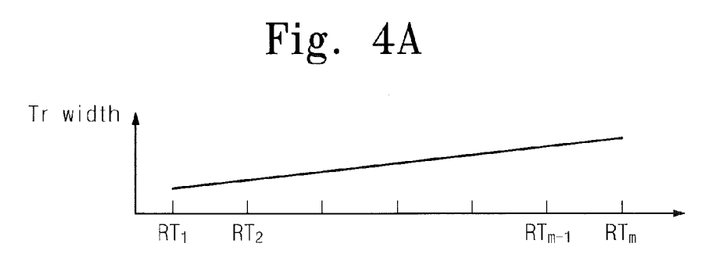
FIG. 4A is a graph illustrating differences in the channel widths of row pass transistors of a row decoder according to some embodiments of the present inventive concept.
Figure 4B:
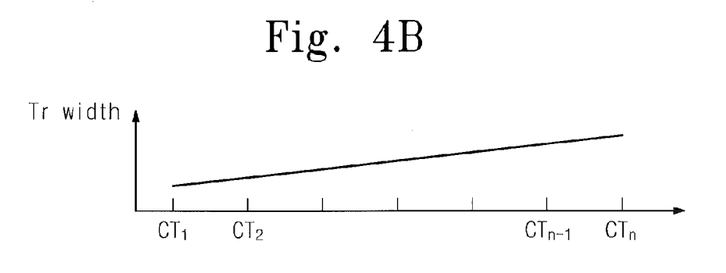
FIG. 4B is a graph illustrating differences in the channel widths of column pass transistors of a column decoder according to some embodiments of the present inventive concept.

FIG. 4A is a graph illustrating differences in the channel widths of the row pass transistors RT1 to RTm of the row decoder 110 in some embodiments, while FIG. 4B is a graph illustrating differences in the channel widths of the column pass transistors CT1 to CTn of the column decoder 120 in some embodiments. As shown in FIG. 4A, the channel widths W of the row pass transistors RT1 to RTm in the row decoder 110 increase from a first row pass transistor RT1 closest to the column decoder 120 to a last row pass transistor RTm furthest from the column decoder 120. Likewise, as shown in FIG. 4B, the channel widths W of the column pass transistors CT1 to CTn in the column decoder 120 increase from a first column pass transistor CT1 closest to the row decoder 110 to a last column pass transistor CTn furthest from the row decoder 110. In other words, ones of pass transistors closer or proximate to the row or column decoders may have narrower channel widths than ones of the pass transistors further or distal from the row or column decoders. Although illustrated in FIGS. 4A and 4B as increasing in a substantially linear fashion, it is to be understood that the channel widths of pass transistors according to some embodiments may be varied in a stepwise or other fashion.

As such, referring now to FIGS. 1, 4A, and 4B, the memory cell 105a, which has the lowest total line resistance due to its closer distance to the decoders 110 and 120 along its respective word line WL and bit line BL, is coupled to the row pass transistor RT1 and the column pass transistor CT1 having the narrowest channel widths. Similarly, the memory cell 105e, which has the greatest total line resistance due to its greater distance from the decoders 110 and 120 along its respective word line WL and bit line BL, is coupled to the row pass transistor RTm and the column pass transistor CTn having the greatest channel widths. In some embodiments, the channel widths of the row pass transistors and/or column pass transistors may be proportional to the relative line resistances of the memory cells coupled thereto. For example, if the word line resistance Rwl and/or bit line resistance Rbl of the memory cell 105e are twice that of the memory cell 105a, the channel width of RTm and/or CTn may be twice as wide as the channel width of RT1 and/or CT1.

Figure 5A:
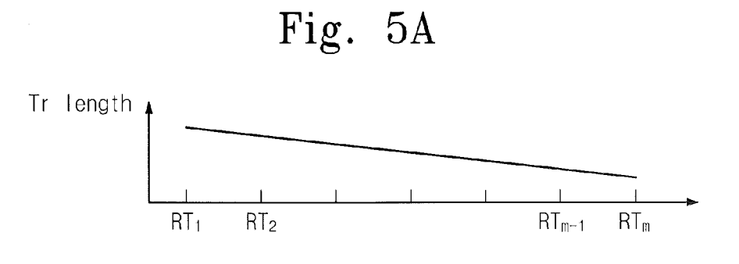
FIG. 5A is a graph illustrating differences in the channel lengths of row pass transistors of a row decoder according to some embodiments of the present inventive concept.
Figure 5B:
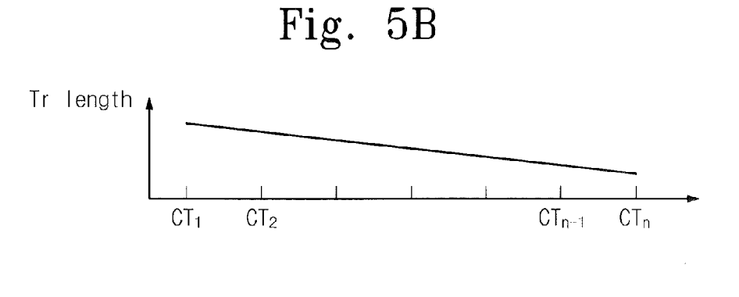
FIG. 5B is a graph illustrating differences in the channel lengths of column pass transistors of a column decoder according to some embodiments of the present inventive concept.

FIG. 5A is a graph illustrating differences in the channel lengths of the row pass transistors RT1 to RTm of the row decoder 110 in some embodiments, while FIG. 5B is a graph illustrating differences in the channel lengths of the column pass transistors CT1 to CTn of the column decoder 120 in some embodiments. As shown in FIG. 5A, the channel lengths L of the row pass transistors RT1 to RTm in the row decoder 110 decrease from a first row pass transistor RT1 closest to the column decoder 120 to a last row pass transistor RTm furthest from the column decoder 120. Likewise, as shown in FIG. 5B, the channel lengths L of the column pass transistors CT1 to CTn in the column decoder 120 decrease from a first column pass transistor CT1 closest to the row decoder 110 to a last column pass transistor CTn furthest from the row decoder 110. In other words, ones of pass transistors proximate to the row or column decoders may have greater channel lengths than ones of the pass transistors distal from the row or column decoders. Although illustrated in FIGS. 5A and 5B as decreasing in a substantially linear fashion, it is to be understood that the channel lengths of pass transistors according to some embodiments may be varied in a stepwise or other fashion.

Accordingly, referring now to FIGS. 1, 5A, and 5B, the memory cell 105a, which has the lowest total line resistance due to its closer distance to the decoders 110 and 120 along its respective word line WL and bit line BL, is coupled to the row pass transistor RT1 and the column pass transistor CT1 having the greatest channel lengths. Similarly, the memory cell 105e, which has the greatest total line resistance due to its further distance from the decoders 110 and 120 along its respective word line WL and bit line BL, is coupled to the row pass transistor RTm and the column pass transistor CTn having the shortest channel lengths. In some embodiments, the channel lengths of the row pass transistors and/or column pass transistors may be inversely proportional to the relative line resistances of the memory cells coupled thereto. For example, if the word line resistance Rwl and/or bit line resistance Rbl of the memory cell 105e are twice that of the memory cell 105a, the channel length of RTm and/or CTn may be half as long as the channel length of RT1 and/or CT1.

Figure 6:
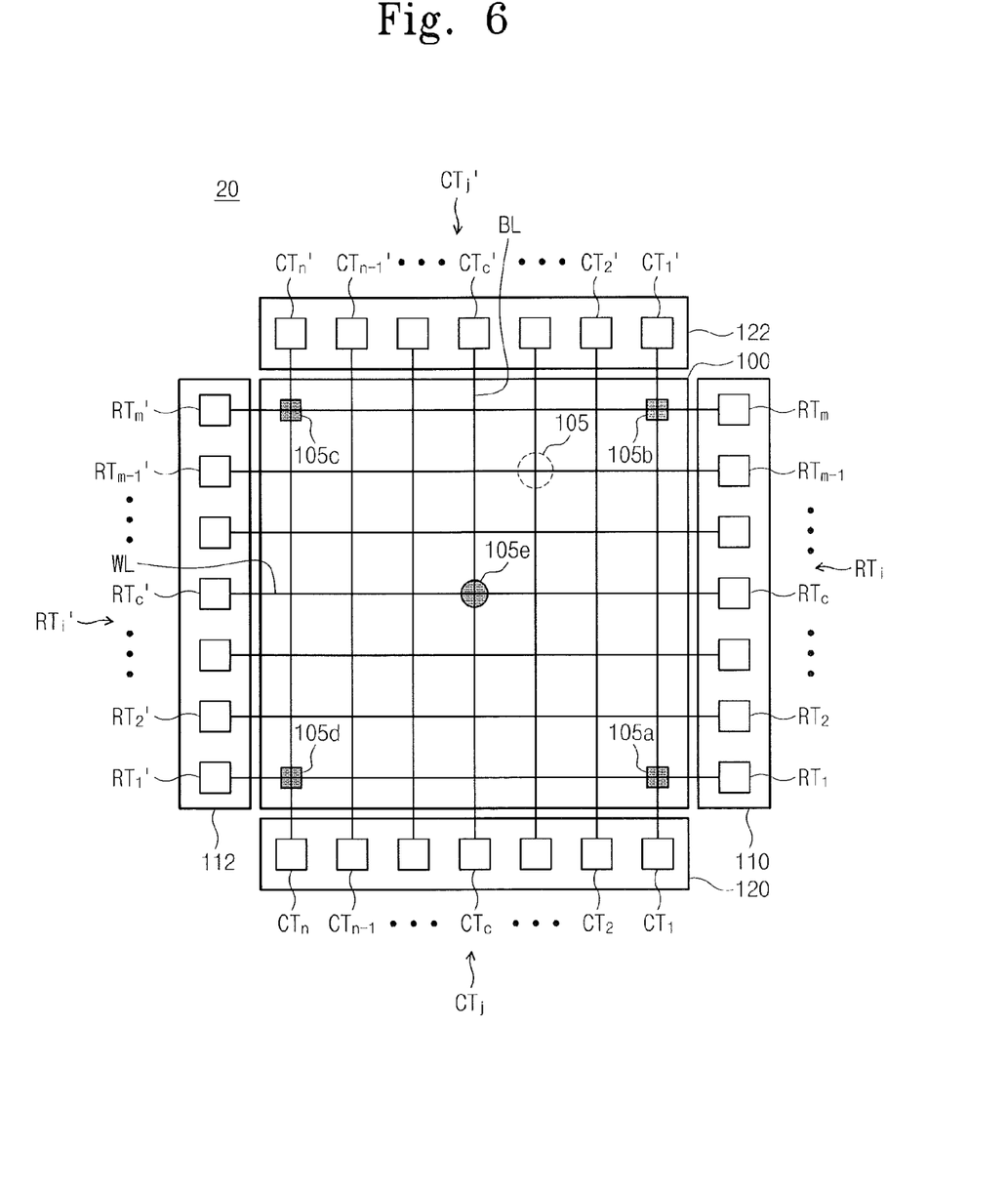
FIG. 6 is a block diagram illustrating a memory device according to further embodiments of the present inventive concept.

FIG. 6 illustrates a memory device according to further embodiments of the present invention. As shown in FIG. 6, the memory device 20 includes a memory cell array 100 and peripheral elements 110, 112, 120, and 122. The cell array 100 includes a plurality of memory cells 105 at cross-points between orthogonally-extending bit lines BL and word lines WL. The peripheral elements 110, 112, 120, and 122 include pass transistors that are configured to supply electrical signals to the word lines WL and/or bit lines BL. In particular, as shown in FIG. 6, the peripheral elements 110 and 112 are row decoders extending along opposite sides of the memory cell array 100, while the peripheral elements 120 and 122 are column decoders extending along opposite sides of the memory cell array 100. The row decoder 110 includes a plurality of row pass transistors RT 1, RT2, . . . RTm−1, RTm, while the row decoder 112 includes a plurality of row pass transistors RT1', RT2', . . . RTm−1', RTm'. The column decoder 120 includes a plurality of column pass transistors CT1, CT2, . . . CTn−1, CTn, while the column decoder 122 includes a plurality of column pass transistors CT1', CT2', . . . CTn−1', CTn'. Each memory cell 105 is electrically coupled to one of the row pass transistors RT1 to RTm and to one of the row pass transistors RT1' to RTm' by a word line WL. Likewise, each memory cell 105 is electrically coupled to one of the column pass transistors CT1 to CTn and to one of the column pass transistors CT1' to CTn' by a bit line BL. In the embodiment of FIG. 6, a memory controller (not shown) may use the row and column decoders closest to a particular memory cell 150 to select that memory cell.

Figure 7A:
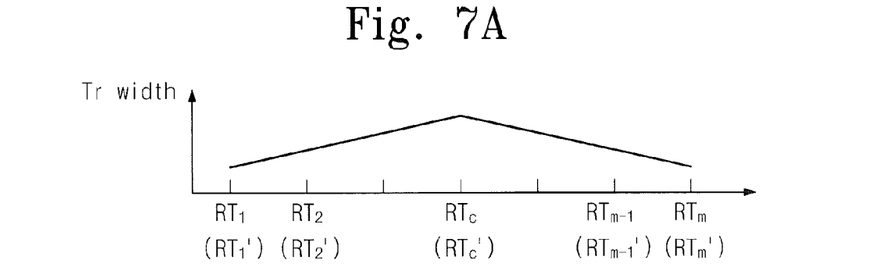
FIG. 7A is a graph illustrating differences in the channel widths of row pass transistors of row decoders according to further embodiments of the present inventive concept.
Figure 7B:
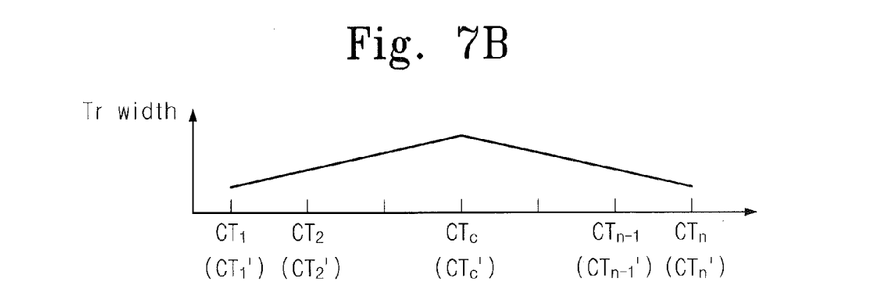
FIG. 7B is a graph illustrating differences in the channel widths of column pass transistors of column decoders according to further embodiments of the present inventive concept.

FIG. 7A is a graph illustrating differences in the channel widths of the row pass transistors RT1 to RTm of the row decoder 110 and the row pass transistors RT1' to RTm' of the row decoder 112 in some embodiments, while FIG. 7B is a graph illustrating differences in the channel widths of the column pass transistors CT1 to CTn of the column decoder 120 and the column pass transistors CT1' to CTn' of the column decoder 122 in some embodiments. As shown in FIG. 7A, ones of the row pass transistors RT1 to RTc and RT1' to RTc' that are closer or proximate to the column decoder 120 have narrower channel widths than ones that are further or distal from the column decoder 120. Likewise, ones of the row pass transistors RTc to RTm and RTc' to RTm' that are closer to the column decoder 122 have narrower channel widths than ones that are further from the column decoder 122. Similarly, as shown in FIG. 7B, ones of the column pass transistors CT1 to CTc and CT1' to CTc' that are closer to the row decoder 110 have narrower channel widths than ones that are further from the row decoder 110, while ones of the column pass transistors CTc to CTn and CTc' to CTn' that are closer to the row decoder 112 have narrower channel widths than ones that are further from the row decoder 112.

Accordingly, referring now to FIGS. 6, 7A, and 7B, the centrally-located memory cell 105e, which has the greatest total line resistance due to its distance from all of the decoders 110, 112, 120, and 122 along its respective word line WL and bit line BL, is coupled to the row pass transistor RTc and RTc' and the column pass transistor CTc and CTc' having the greatest channel widths. Likewise, the memory cells 105a, 105b, 105c, and 105d, which have the lowest total line resistances due to their close proximity to at least two of the decoders 110, 112, 120, and 122 along their respective word lines WL and bit lines BL, are coupled to the row and column pass transistors having the narrowest channel widths. In particular, memory cell 105a is coupled to pass transistors RT1 and CT1, memory cell 105b is coupled to pass transistors RTm and CT1', memory cell 105c is coupled to pass transistors RTm' and CTn', and memory cell 105d is coupled to pass transistors RT1' and CTn.

Figure 8A:
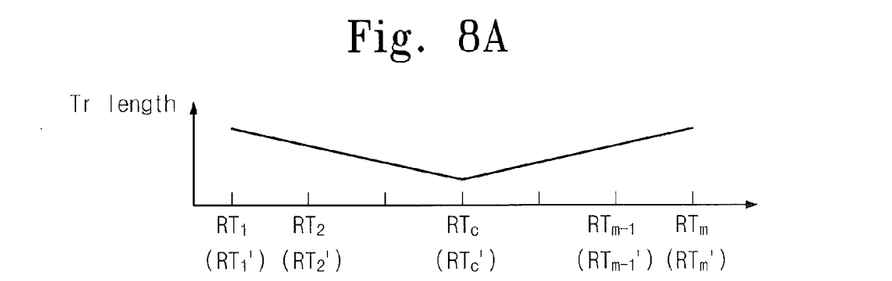
FIG. 8A is a graph illustrating differences in the channel lengths of row pass transistors of the row decoders according to further embodiments of the present inventive concept.
Figure 8B:
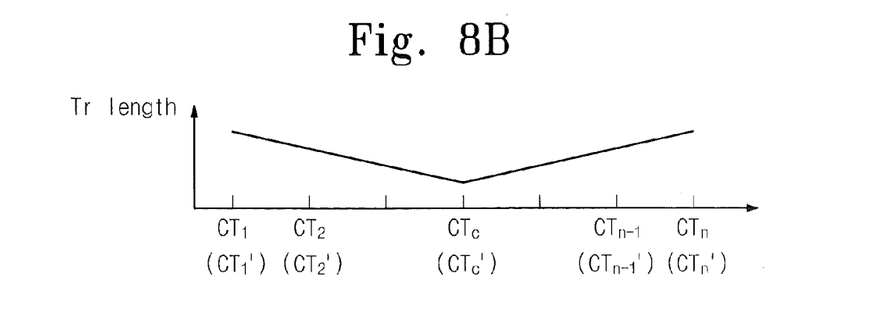
FIG. 8B is a graph illustrating differences in the channel lengths of the column pass transistors of column decoders according to further embodiments of the present inventive concept.

FIG. 8A is a graph illustrating differences in the channel lengths of the row pass transistors RT1 to RTm of the row decoder 110 and the row pass transistors RT1' to RTm' of the row decoder 112 in some embodiments, while FIG. 8B is a graph illustrating differences in the channel lengths of the column pass transistors CT1 to CTn of the column decoder 120 and the column pass transistors CT1' to CTn' of the column decoder 122 in some embodiments. As shown in FIG. 8A, ones of the row pass transistors RT1 to RTc and RT1' to RTc' that are closer or proximate to the column decoder 120 have greater channel lengths than ones that are further or distal from the column decoder 120. Similarly, ones of the row pass transistors RTc to RTm and RTc' to RTm' that are closer to the column decoder 122 have greater channel lengths than ones that are further from the column decoder 122. Likewise, as shown in FIG. 8B, ones of the column pass transistors CT1 to CTc and CT1' to CTc' that are closer to the row decoder 110 have greater channel lengths than ones that are further from the row decoder 110, while ones of the column pass transistors CTc to CTn and CTc' to CTn' that are closer to the row decoder 112 have greater channel lengths than ones that are further from the row decoder 112.

Accordingly, referring now to FIGS. 6, 8A, and 8B, the centrally-located memory cell 105e, which has the greatest total line resistance due to its distance from the decoders 110, 112, 120, and 122 along the word line WL and bit line BL connected thereto, is coupled to the row pass transistors RTc and RTc' and the column pass transistor CTc and CTc' having the shortest channel lengths. Likewise, the memory cells 105a, 105b, 105c, and 105d, which have the lowest total line resistances due to their close proximity to at least two of the decoders 110, 112, 120, and 122 along their respective word lines WL and bit line BLs, are coupled to the row and column pass transistors having the greatest channel lengths. In particular, memory cell 105a is coupled to pass transistors RT1 and CT1, memory cell 105b is coupled to pass transistors RTm and CT1', memory cell 105c is coupled to pass transistors RTm' and CTn', and memory cell 105d is coupled to pass transistors RT1' and CTn.

Figure 9:
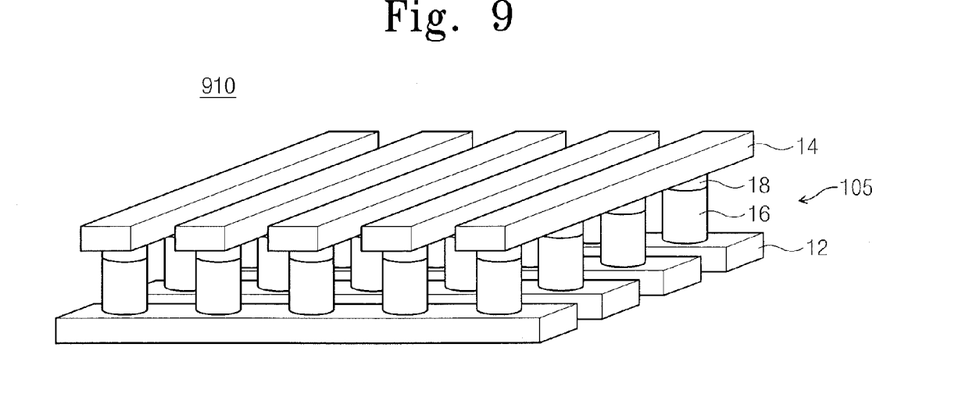
FIG. 9 is a perspective view illustrating a resistive random access memory (RRAM) device according to some embodiments of the present inventive concept.

FIG. 9 is a perspective view illustrating a resistive random access memory (RRAM) device according to some embodiments. As shown in FIG. 9, the RRAM device 910 includes a resistive storage element 18 (such as a perovskite material) and a diode 16 coupled between an upper electrode 14 and a lower electrode 12. Each of the upper electrodes 14 may correspond to and/or be coupled to a word line WL, while each of the lower electrodes 12 may correspond to/be coupled to a bit line BL (or vice versa). The level of resistance provided by the resistive storage element 18 may be altered according to a voltage applied to the upper and lower electrodes 14 and 12. The resistive storage element 18 and the diode 16 may thereby define a variable-resistance memory cell, such as one of the memory cells 105 discussed above. When selected, the memory cell including the resistive storage element 18 and the diode 16 may connect the upper electrode 14 and the lower electrode 12 in the same current path.

Figure 10:
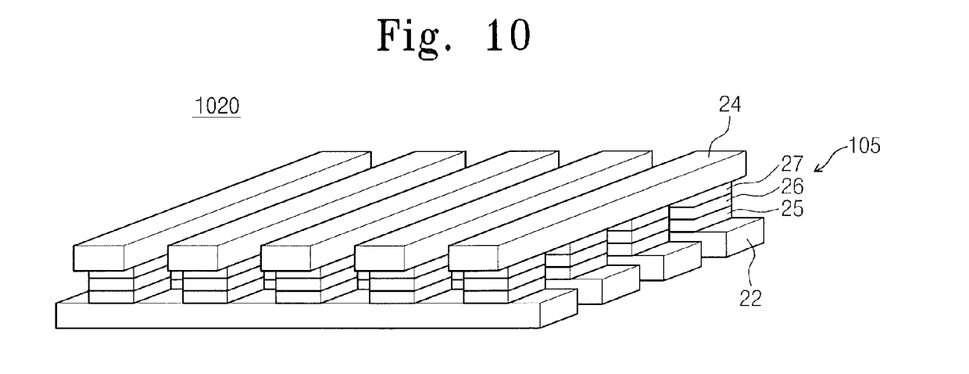
FIG. 10 is a perspective view illustrating a magnetic random access memory (MRAM) device according to some embodiments of the present inventive concept.

FIG. 10 is a perspective view illustrating a magnetic random access memory (MRAM) device according to some embodiments. As shown in FIG. 10, the MRAM device 1020 includes a reference layer 25, a barrier layer 26, and a data layer 27 coupled between an upper electrode 24 and a lower electrode 22. Each of upper electrodes 24 may correspond to and/or be coupled to a word line WL, while each of the lower electrodes 22 may correspond to/be coupled to a bit line BL (or vice versa). The reference layer 25, the barrier layer 26, and the data layer 27 define a magnetic tunnel junction (MTJ) storage element. In particular, the reference layer 25 may provide a "pinned" ferromagnetic layer, and the data layer 27 may provide a "free" ferromagnetic layer, such that the resistance of the magnetic storage element may be altered depending on the magnetization direction of the data layer 27 relative to that of the reference layer 25. As such, the reference layer 25, the barrier layer 26, and the data layer 27 define a variable-resistance memory cell, such as one of the memory cells 105 discussed above, that electrically connects the upper electrode 24 and the lower electrode 22 in the same current path when selected.

Figure 11:
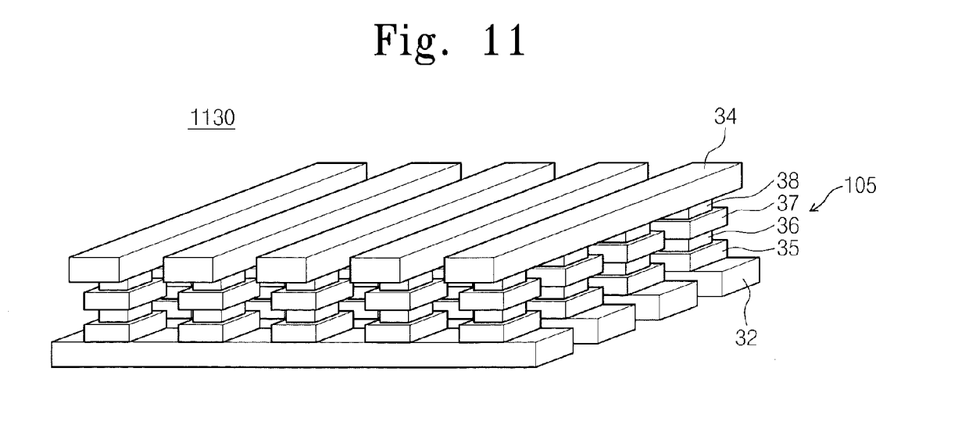
FIG. 11 is a perspective view illustrating a phase-changeable random access memory (PRAM) device according to some embodiments of the present inventive concept.

FIG. 11 is a perspective view illustrating a phase-changeable random access memory (PRAM) device according to some embodiments. As shown in FIG. 11, the PRAM device 1130 includes a diode or transistor 35, a conductive or heating element 36, a phase-changeable material layer 37 (such as a chalcogen compound), and contact layer 38, which are coupled between an upper electrode 34 and a lower electrode 32. Each of the upper electrodes 34 may correspond to and/or be coupled to a word line WL, while each of the lower electrodes 32 may correspond to/be coupled to a bit line BL (or vice versa). The diode or transistor 35, the heating element 36, the phase-changeable material layer 37, and the contact layer 38, provide a phase-changeable storage element. In particular, the phase changeable material layer 37 may be switched between a low-resistance crystalline state and a high-resistance amorphous state based on electrical signal applied via the heating element 36. As such, the diode or transistor 35, the heating element 36, the phase-changeable material layer 37, and the contact layer 38, define a variable-resistance memory cell, such as one of the memory cells 105 discussed above, that electrically connects the upper electrode 34 and the lower electrode 32 in the same current path when selected.

Figure 12:
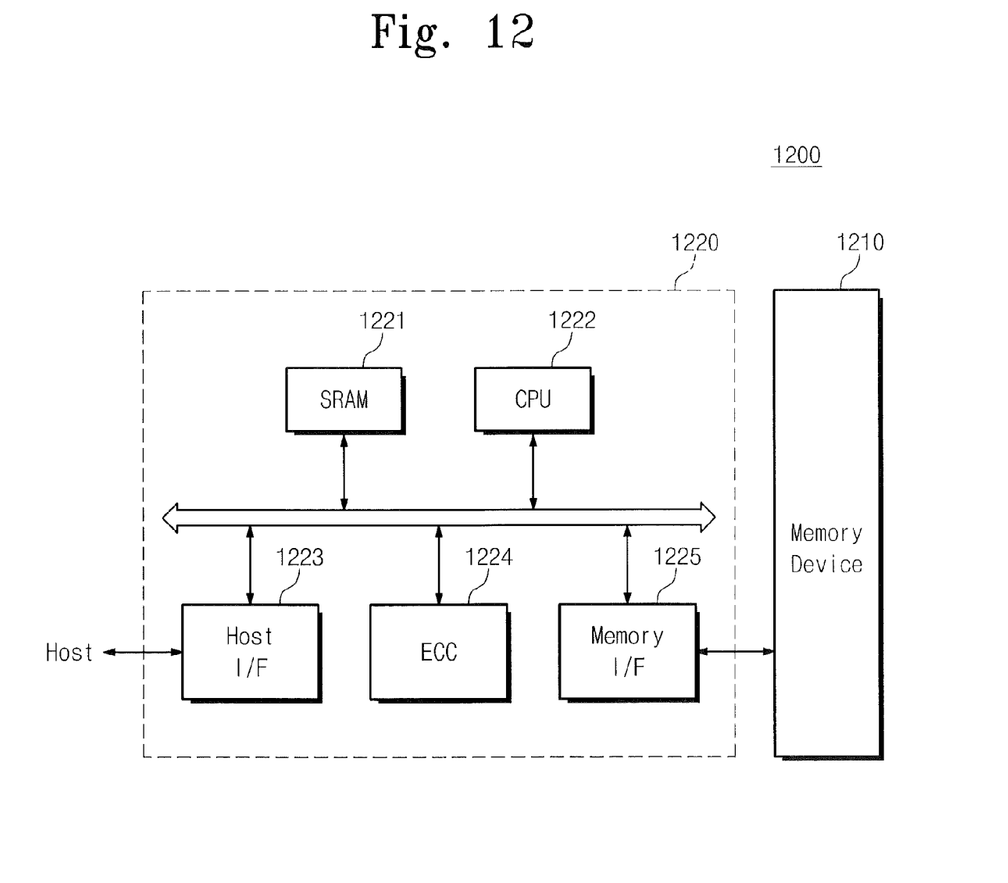
FIG. 12 is a block diagram illustrating a data storage device according to some embodiments of the present inventive concept.

FIG. 12 is a block diagram illustrating a data storage device according to some embodiments of the present inventive concept. As shown in FIG. 12, the data storage device 1200 includes a memory device 1210 and a memory controller 1220 coupled thereto. The memory controller 1220 includes a memory interface unit 1225, a host interface unit 1223, a central processing unit (CPU) 1222, and a static random access memory (SRAM) unit 1221 communicatively coupled by a bus 1226. A host interface unit 1223 is configured to communicate with an external host device (not shown). The memory device 1210 may include one or more of the memory devices and/or memory cells described above with reference to FIGS. 1-11.

Figure 13:
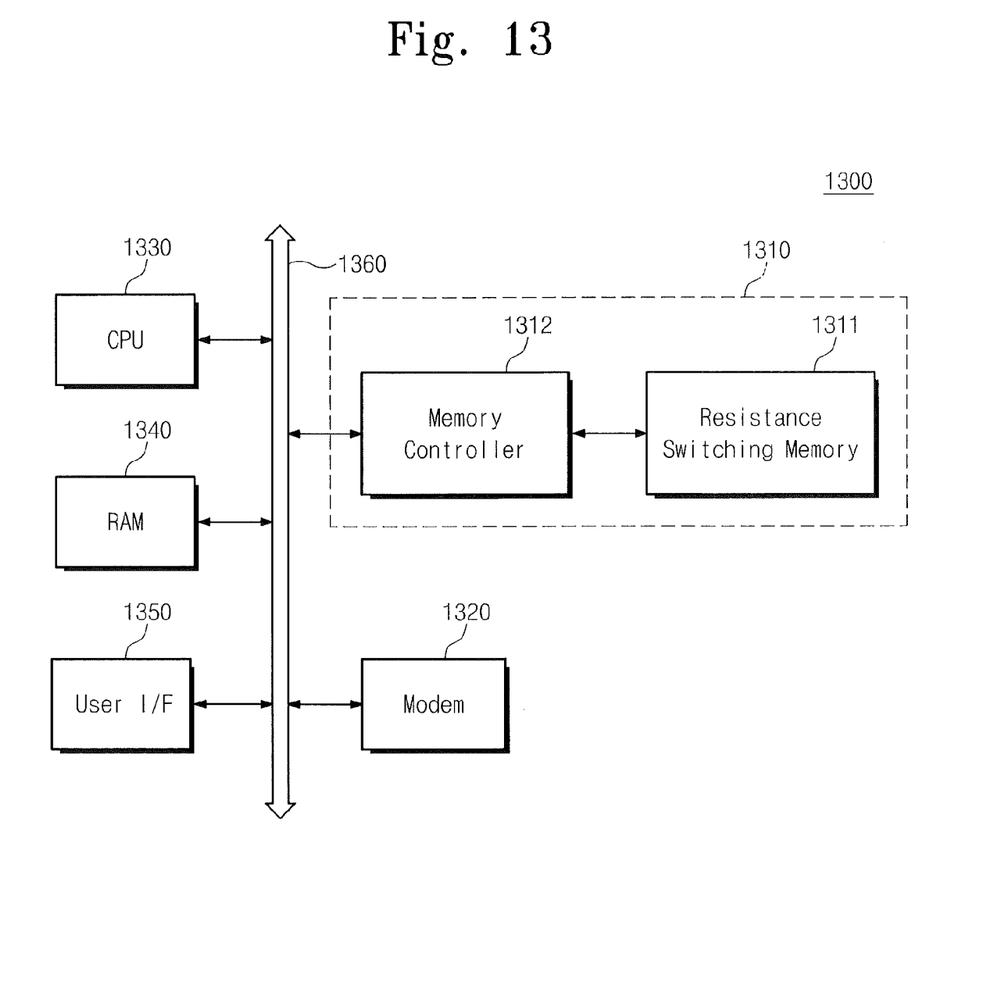
FIG. 13 is a block diagram illustrating an electronic system according to some embodiments of the present inventive concept.

FIG. 13 is a block diagram illustrating an electronic system according to some embodiments of the present inventive concept. As shown in FIG. 13, the system 1300 includes a memory unit 1310, a modem 1320, a central processing unit (CPU) 1330, a random access memory (RAM) unit 1340, and a user interface 1350 communicatively coupled by a bus 1360. The memory unit 1310 may include a memory controller 1312 and a variable resistance memory 1311. The memory controller 1312 may, for example, be similar to the memory controller 1220 described above with reference to FIG. 12. The memory device 1311 may include one or more of the memory devices and/or memory cells described above with reference to FIGS. 1-11.

In general, embodiments of the present inventive concept provide transistors and/or diodes of different resistances to at least partially compensate for the differences in total line resistance of memory cells at different locations in a memory cell array. Such embodiments may be applicable to any memory device configuration where a selected memory cell electrically connects a bit line and a word line in a same current path.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

That which is claimed:

1. An integrated circuit memory device, comprising:
a memory cell array comprising memory cells having respective data storage regions therein;
a plurality of pass transistors having different channel widths and/or channel lengths; and
a plurality of conductive lines, each of the conductive lines electrically coupling a respective one of the pass transistors to ones of the memory cells,
wherein each of the memory cells has a line resistance defined by a portion of the corresponding one of the conductive lines extending between the memory cell and the pass transistor coupled thereto, and wherein ones of the memory cells having greater line resistances are coupled to ones of the pass transistors having greater channel widths and/or shorter channel lengths.

2. The device of claim 1, wherein the plurality of pass transistors are row pass transistors that define a row decoder, wherein each of the conductive lines comprises a word line electrically coupling a respective one of the row pass transistors to ones of the memory cells in a respective row of the array, wherein the line resistance of each of the memory cells comprises a word line resistance, and further comprising:
a column decoder comprising column pass transistors having different channel widths and/or channel lengths; and
a plurality of bit lines, each of the bit lines electrically coupling a respective one of the column pass transistors to ones of the memory cells in a respective column of the array;
wherein each of the memory cells has a bit line resistance defined by a portion of the corresponding bit line extending between the memory cell and the column pass transistor coupled thereto, and wherein ones of the memory cells having greater bit line resistances are coupled to ones of the column pass transistors having greater channel widths and/or shorter channel lengths.

3. The device of claim 2, wherein each of the memory cells is configured to electrically connect a corresponding word line to a corresponding bit line such that the corresponding word line resistance and the corresponding bit line resistance define a total line resistance for that memory cell.

4. The device of claim 3, wherein each of the memory cells includes a diode therein, and wherein ones of the memory cells having greater total line resistances respectively include the diode having a lower resistance than ones of the memory cells having smaller total line resistances.

5. The device of claim 2, wherein ones of the memory cells coupled to a same row pass transistor by a respective word line have different word line resistances therealong, and wherein ones of the memory cells having greater word line resistances along the respective word line are coupled to respective ones of the column pass transistors having greater channel widths and/or shorter channel lengths.

6. The device of claim 2, wherein ones of the memory cells coupled to a same column pass transistor by a respective bit line have different bit line resistances therealong, and wherein ones of the memory cells having greater bit line resistances along the respective bit line are coupled to respective ones of the row pass transistors having greater channel widths and/or shorter channel lengths.

7. The device of claim 2, wherein the ones of the memory cells having greater word line resistances are located at greater distances from the row decoder along the respective word lines, and wherein the ones of the memory cells having greater bit line resistances are located at greater distances from the column decoder along the respective bit lines.

8. The device of claim 2, wherein the channel widths of the row pass transistors increase from a first one of the row pass transistors closest to the column decoder to a last one of the row pass transistors furthest therefrom, and wherein the channel widths of the column pass transistors increase from a first one of the column pass transistors closest to the row decoder to a last one of the column pass transistors furthest therefrom.

9. The device of claim 8, wherein the relative channel widths of the row pass transistors and/or the column pass transistors increase in a substantially linear or stepwise fashion.

10. The device of claim 2, wherein the row decoder comprises first and second row decoders extending along opposite sides of the memory cell array, wherein the column decoder comprises first and second column decoders extending along opposite sides of the memory cell array, wherein ones of the row pass transistors proximate to the first and/or second column decoders have narrower channel widths than ones of the row pass transistors distal therefrom, and wherein ones of the column pass transistors proximate to the first and/or second row decoders have narrower channel widths than ones of the column pass transistors distal therefrom.

11. The device of claim 2, wherein the channel lengths of the row pass transistors decrease from a first one of the row pass transistors closest to the column decoder to a last one of the row pass transistors furthest therefrom, and wherein the channel lengths of the column pass transistors decrease from a first one of the column pass transistors closest to the row decoder to a last one of the column pass transistors furthest therefrom.

12. The device of claim 11, wherein the relative channel lengths of the row pass transistors and/or the column pass transistors decrease in a substantially linear or stepwise fashion.

13. The device of claim 2, wherein the row decoder comprises first and second row decoders extending along opposite sides of the memory cell array, wherein the column decoder comprises first and second column decoders extending along opposite sides of the memory cell array, wherein ones of the row pass transistors proximate to the first and/or second column decoders have greater channel lengths than ones of the row pass transistors distal therefrom, and wherein ones of the column pass transistors proximate to the first and/or second row decoders have greater channel lengths than ones of the column pass transistors distal therefrom.

14. The device of claim 1, wherein the relative channel widths of ones of the pass transistors are proportional to the relative line resistances of the respective memory cells coupled thereto.

15. The device of claim 1, wherein the relative channel lengths of ones of the pass transistors are inversely proportional to the relative line resistances of the respective memory cells coupled thereto.

16. The device of claim 1, wherein the memory device comprises one of a resistive random access memory (RRAM) device including resistive storage elements therein, a magnetic random access memory (MRAM) device including magnetic storage elements therein, and a phase-changeable random access memory (PRAM) device including phase-changeable storage elements therein.

17. A data storage device, comprising:
a memory unit;
a memory interface unit configured to communicate with the memory unit;
a host interface configured to communicate with a host device;
a processor; and
a bus that communicatively couples the processor, the memory interface, and the host interface,
wherein the memory unit comprises an integrated circuit memory device according to claim 1.

18. An electronic system, comprising:
a processor;
a memory unit;
a user interface; and
a bus that communicatively couples the processor, the memory unit, and the user interface,
wherein the memory unit comprises an integrated circuit memory device according to claim 1.

19. An integrated circuit memory device, comprising:
first and second conductive lines;
a memory cell array comprising a first memory cell and a second memory cell coupled to the first and second conductive lines, respectively; and
a first pass transistor and a second pass transistor coupled to the first and second conductive lines, respectively, the second pass transistor having a greater channel width and/or a shorter channel length than the first pass transistor,
wherein a resistance between the second memory cell and the second pass transistor along the second conductive line is greater than a resistance between the first memory cell and the first pass transistor along the first conductive line.

20. The device of claim 19, wherein the first and second pass transistors comprise first and second row pass transistors of a row decoder, wherein the first and second conductive lines comprise first and second word lines, and further comprising:
first and second bit lines coupled to the first and second memory cells, respectively; and
a column decoder comprising first and second column pass transistors coupled to the first and second bit lines, respectively, the second column pass transistor having a greater channel width and/or a shorter channel length than the first column pass transistor,
wherein a resistance between the second memory cell and the second column pass transistor along the second bit line is greater than a resistance between the first memory cell and the first column pass transistor along the first bit line.

21. The device of claim 20, wherein the first memory cell is configured to electrically connect the first bit line to the first word line such that the resistance along the first bit line and the resistance along the first word line define a total line resistance for the first memory cell, and wherein the second memory cell is configured to electrically connect the second bit line to the second word line such that the resistance along the second bit line and the resistance along the second word line define a total line resistance for the second memory cell that is greater than the total line resistance for the first memory cell.

22. The device of claim 21, wherein the first and second memory cells include first and second diodes, respectively, and wherein the first diode has a greater resistance than the second diode.

23. The device of claim 19, wherein a distance between the second memory cell and the second pass transistor along the second conductive line is greater than a distance between the first memory cell and the first pass transistor along the first conductive line.

24. An integrated circuit memory device, comprising:
a memory cell array comprising memory cells, each of the memory cells comprising a data storage region and a diode therein;
a plurality of pass transistors; and
a plurality of conductive lines, each of the conductive lines electrically coupling a respective one of the pass transistors to ones of the memory cells,
wherein each of the memory cells has a line resistance defined by a portion of the corresponding one of the conductive lines extending between the memory cell and the pass transistor coupled thereto, and wherein ones of the memory cells having greater line resistances comprise diodes having lower resistances.

25. The device of claim 24, wherein the plurality of pass transistors are row pass transistors that define a row decoder, wherein each of the conductive lines comprises a word line electrically coupling a respective one of the row pass transistors to ones of the memory cells in a respective row of the array, wherein the line resistance of each of the memory cells comprises a word line resistance, and further comprising:
a column decoder comprising column pass transistors having different channel widths and/or channel lengths; and
a plurality of bit lines, each of the bit lines electrically coupling a respective one of the column pass transistors to ones of the memory cells in a respective column of the array;
wherein each of the memory cells has a bit line resistance defined by a portion of the corresponding bit line extending between the memory cell and the column pass transistor coupled thereto, wherein each of the memory cells is configured to electrically connect a corresponding word line to a corresponding bit line such that the corresponding word line resistance and the corresponding bit line resistance define a total line resistance for that memory cell, and wherein ones of the memory cells having greater total line resistances comprise diodes having lower resistances.

26. The device of claim 24, wherein the pass transistors have different channel widths and/or channel lengths, and wherein the ones of the memory cells having the greater line resistances are coupled to ones of the pass transistors having greater channel widths and/or shorter channel lengths than ones of the memory cells having smaller line resistances.

27. The device of claim 24, wherein the ones of the memory cells having the greater line resistances are located at greater distances from the pass transistor coupled thereto along the corresponding one of the conductive lines extending therebetween.

* * * * *